United States Patent [19]

Uchida et al.

[11] Patent Number: 5,391,924
[45] Date of Patent: Feb. 21, 1995

[54] PLASTIC PACKAGE TYPE SEMICONDUCTOR DEVICE

[75] Inventors: Ken Uchida, Tokyo; Kiyoaki Suzuki, Kawasaki, both of Japan

[73] Assignee: Kabushiki Kaisha Toshiba, Kawasaki, Japan

[21] Appl. No.: 120,336

[22] Filed: Sep. 14, 1993

[30] Foreign Application Priority Data

Sep. 14, 1992 [JP] Japan ................... 4-244864

[51] Int. Cl.⁶ ............................................ H01L 23/28
[52] U.S. Cl. .................... 257/789; 257/788; 257/793
[58] Field of Search .......... 257/787, 789, 788, 792, 257/793

[56] References Cited

U.S. PATENT DOCUMENTS 5,181,097 1/1993 Ogata et al. .................... 257/778

FOREIGN PATENT DOCUMENTS 61-203121 9/1986 Japan .
3-237151 10/1991 Japan .
4-18445 1/1992 Japan .
4-96963 3/1992 Japan .

*Primary Examiner*—Robert P. Limanek
*Assistant Examiner*—Roy Potter
*Attorney, Agent, or Firm*—Oblon, Spivak, McClelland, Maier & Neustadt

[57] ABSTRACT

Disclosed is a plastic package type semiconductor device having a semiconductor element encapsulated with an epoxy resin composition, said resin composition containing as indispensable components (a) an epoxy resin, (b) a curing agent, (c) a curing promotor, (d) a first inorganic powder having an average diameter of 5 to 40 μm and a smooth outer surface substantially free from edges, ridges and projections, and (e) a second inorganic powder having an average diameter of 0.1 to 10 μm and a heat conductivity of at least 4.0 W/m·K, the mixing amount of the first inorganic powder (d) being 10 to 50% by volume based on the sum of the first inorganic powder (d) and the second inorganic powder (e).

8 Claims, 1 Drawing Sheet

PLASTIC PACKAGE TYPE SEMICONDUCTOR DEVICE

BACKGROUND OF THE INVENTION

1. Field of the Invention

The present invention relates to a plastic package type semiconductor device, more particularly, to a plastic package type semiconductor device in which a semiconductor integrated circuit chip is encapsulated in a molded layer of an epoxy resin composition.

2. Description of the Related Art

In semiconductor devices in recent years, a marked improvement is being achieved in the density of the elements and the operating speed of the devices, as seen from ASIC (Application Specific IC), with the result that the power consumption tends to be increased in these semiconductor devices. With increase in the power consumption, an excellent heat dissipation performance is required for the package of the semiconductor device.

It was customary in the past to use an epoxy resin as an encapsulating resin in a plastic package type semiconductor device. However, the conventional epoxy resin exhibits such a low heat conductivity as about 0.1 to 0.3 W/m·K, resulting in failure to achieve a sufficient heat dissipation. To overcome the difficulty, inorganic fillers are added to the epoxy resin so as to improve the heat conductivity of the resin. For example, the conventional encapsulating resin composition is provided by a thermosetting resin composition prepared by adding to an epoxy resin a fused silica powder as an inorganic filler, a curing agent, etc.

However, the heat conductivity of the fused silica is about 0.7 W/m·K, which is not sufficiently high, with the result that the epoxy resin composition containing the fused silica fails to exhibit a sufficiently high heat conductivity.

To impart a sufficient heat conductivity to an epoxy resin, it is proposed to add to the epoxy resin inorganic fillers having a heat conductivity higher than that of fused silica. For example, it is proposed to add inorganic fillers such as beryllium oxide, aluminum nitride, magnesium oxide, boron nitride and silicon nitride to the epoxy resin. However, particles of these inorganic fillers having a high heat conductivity have in general a hardness greater than that of the fused silica particle. The high hardness of these inorganic fillers causes the molding die to be severely abraded in the molding step of the encapsulating resin.

What should also be noted is that a resin composition containing inorganic fillers is generally low in its flowability. It follows that the molding efficiency is low in any of the case of using an epoxy resin composition containing the fused silica and the case of using an epoxy resin composition containing the inorganic filler having a high heat conductivity.

As described above, the conventional plastic package type semiconductor device leaves much room for further improvement. Specifically, it is very difficult to prevent the moldability from being impaired and the molding die from being abraded in the molding step in the manufacture of a semiconductor device encapsulated with an epoxy resin composition containing an inorganic filler which is intended to enable the resin composition to exhibit a sufficient heat dissipation.

SUMMARY OF THE INVENTION

A first object of the present invention is to impart an excellent heat dissipation performance to the encapsulating resin of a plastic package type semiconductor device by adding inorganic filler particles to the encapsulating resin while preventing the moldability from being impaired and the molding die from being abraded in the molding step.

A second object is to provide a plastic package type semiconductor device in which a semiconductor element is encapsulated with an epoxy resin composition exhibiting a high heat conductivity and having other required characteristics such as reasonable mechanical strength, etc.

According to the present invention, there is provided a plastic package type semiconductor device having a semiconductor element encapsulated with an epoxy resin composition, the resin composition containing as indispensable components:

(a) an epoxy resin;
(b) a curing agent;
(c) a curing promotor;
(d) a first inorganic powder having an average diameter of 5 to 40 $\mu$m and a smooth outer surface substantially free from edges, ridges and projections; and
(e) a second inorganic powder having an average diameter of 0.1 to 10 $\mu$m and a heat conductivity of at least 4.0 W/m·K;

the mixing amount of the first inorganic powder (d) being 10 to 50% by volume based on the sum of the first inorganic powder (d) and the second inorganic powder (e).

It is important to note that the first inorganic powder (d) having a larger particle diameter is used in combination with the second inorganic powder (e) having a smaller particle diameter in the present invention. This is one of the important features of the present invention as apparent from the description which follows.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWING

The accompanying drawing, which is incorporated in and constitutes a part of the specification, illustrates presently preferred embodiments of the invention and, together with the general description given above and the detailed description of the preferred embodiments given below, serves to explain the principles of the invention.

DETAILED DESCRIPTION OF THE PREFERRED EMBODIMENTS

Figure 1:
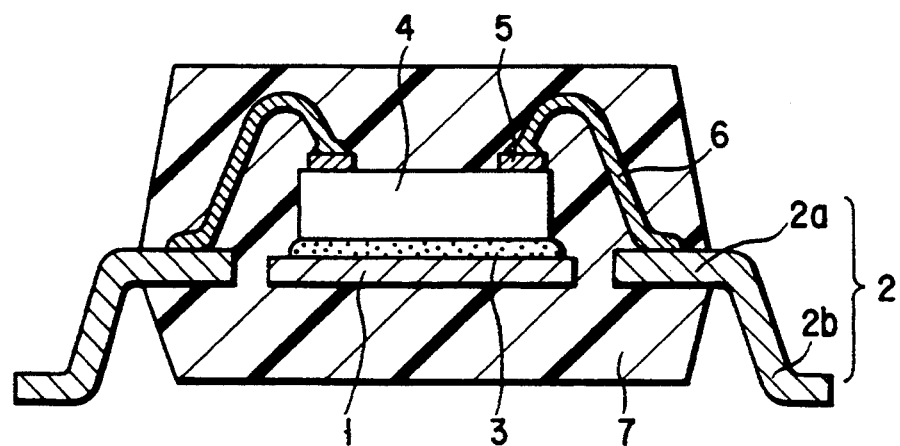
FIG. 1 is a cross sectional view exemplifying a plastic package type semiconductor device of the present invention.

A first feature of the present invention resides in that, in order to enable the plastic package to exhibit a sufficient heat dissipation, an inorganic powder having a predetermined high heat conductivity, i.e., the second inorganic powder (e), is contained in the encapsulating epoxy resin composition.

A second feature resides in the means for preventing the molding die from being abraded in the molding step with the encapsulating resin composition containing an inorganic powder having a high heat conductivity. To be more specific, particle size of the second inorganic powder (e) having a high heat conductivity is diminished to a predetermined level so as to prevent the molding die from being abraded in the molding step.

Further, a third feature of the present invention relates to the moldability of the encapsulating epoxy resin composition. As described previously, addition of the inorganic powder causes the flowability of the encapsulating epoxy resin composition to be lowered, leading to a poor moldability of the composition. The degree of lowering of the flowability is increased with decrease in the particle size of the inorganic powder to be added. In the present invention, the inorganic powder having a high heat conductivity, i.e., second inorganic powder (e), has a small particle diameter in view of the second feature as described previously. It follows that it is very important in the present invention to prevent the flowability of the encapsulating resin composition from being lowered.

As a result of an extensive research made in an attempt to overcome the difficulty, the present inventors have found that it is possible to suppress the lowering of the flowability by using a predetermined amount of the first inorganic powder (d) having a larger particle size in combination with the second inorganic powder (e). The particle of the first inorganic powder (d) should have a smooth outer surface substantially free from edges, ridges or projections. As far as these conditions are satisfied, a fused silica or an inorganic powder having a high heat conductivity such as beryllium oxide or aluminum nitride can be used as the first inorganic powder (d).

As described above, the first, second and third features are combined in the present invention so as to achieve the desired object.

The technical idea of the present invention can be applied to any kind of a plastic package type semiconductor device including the DIP type and the QFP type. FIG. 1 shows as an example the construction of a flat package type resin encapsulated semiconductor device of the present invention. As shown in the drawing, a lead 2 consisting of an inner lead portion 2a and an outer lead portion 2b is arranged in the vicinity of a bed portion 1. A semiconductor integrated circuit chip 4 is mounted on the bed portion 1 with a die bonding layer 3 interposed therebetween. The die bonding layer 3 is formed of, for example, an epoxy resin containing Ag particles. A bonding pad 5 made of a wiring metal such as aluminum is formed on the surface of the semiconductor chip 4. The bonding pad 5 is connected via a bonding wire such as a Au wire to the inner lead portion 2a. Further, these bed portion 1, die bonding layer 3, semiconductor integrated circuit chip 4, bonding pad 5, bonding wire 6 and inner lead portion 2a are encapsulated with an epoxy resin layer 7. As seen from the drawing, the outer lead portion 2a extending outward from the resin layer 7 is bent such that the tip portion thereof is rendered parallel with the bottom surface of the resin layer 7. As a result, the system shown in FIG. 1 is adapted for the planar mounting.

An epoxy resin composition is used for forming the encapsulating resin layer 7 included in the plastic package type semiconductor device of the present invention. The epoxy resin composition is described in detail as follows.

The epoxy resin composition used in the present invention comprises an epoxy resin (a) as a matrix resin. It is desirable to use an epoxy resin (a) having at least two epoxy groups in a molecule. Specifically, the epoxy resin (a) used in the present invention includes, for example, a bisphenol-A type epoxy resin, a novolak type epoxy resin, an alicyclic epoxy resin, an epoxy compound derived from tri- or tetra (hydroxyphenyl) alkane, and a bis-hydroxybiphenyl type epoxy resin. These epoxy resins can be used singly or in the form of a mixture of at least two of these epoxy resins.

The epoxy resin composition used in the present invention also contains a curing agent (b), which is provided by, for example, a phenolic resin. To be more specific, the curing agent (b) includes, for example, phenol novolak resin, cresol novolak resin, t-butylphenol novolak resin, nonylphenol novolak resin, phenol aralkyl resin, dicyclopentadiene phenol novolak resin, and a polyfunctional phenolic resin such as tris (hydroxyphenyl) alkane. These phenolic resins can be used singly or in the form of a mixture of at least two of these phenolic resins.

In the epoxy resin composition of the present invention, the mixing amounts of the epoxy resin (a) and the phenolic resin acting as the curing agent (b) should be determined such that the equivalent ratio of the phenolic hydroxyl group to the epoxy group, i.e., the value of OH equivalent/epoxy equivalent, should fall within a range of between about 0.5 and about 1.5. Where the equivalent ratio noted above fails to fall within the range noted above, the curing characteristics of the resin composition tend to be impaired, leading to an insufficient humidity resistance of the cured resin composition.

The epoxy resin composition used in the present invention also contains a curing promotor (c). The curing promotor generally used in a thermosetting resin composition can be used as the curing promotor (c) in the present invention, though it is desirable to use, for example, a basic catalyst as the curing promotor (c). The specific compound used as the curing promotor (c) includes, for example, an organic phosphine compound such as trimethylphosphine, triethylphosphine, tributylphosphine, triphenylphosphine, tri(p-methylphenyl)-phosphine, tri(nonylphenyl)phosphine, methyldiphenylphosphine, dibutylphenylphosphine, tricyclohexylphosphine, 1,2-bis(diphenylphosphine)ethane, or bis(diphenylphosphine)methane; an imidazole compound such as 2-methylimidazole, 2,4-dimethylimidazole, 2-ethyl-4-methylimidazole, 2-phenylimidazole, 2-phenyl-4-methylimidazole, 2-heptadecylimidazole or derivatives thereof; DBU (1,8-diazabicyclo(5,4,0)undecene-7) or a phenol salt thereof. These curing promotors can be used singly or in the form of a mixture of at least two of these compounds.

In the epoxy resin composition used in the present invention, the mixing amount of the curing promotor (c), which depends on the kind of the curing promotor, should desirably be about 0.01 to 10% by weight based on the total amounts of the epoxy resin (a) and the curing agent (b). If the mixing amount is smaller than 0.01% by weight, the curing Characteristics of the resin composition are impaired. On the other hand, if the mixing amount exceeds 10% by weight, the humidity resistance of the cured resin composition tends to be insufficient.

The epoxy resin composition used in the present invention also contains the first inorganic powder (d) which corresponds to an inorganic filler. An inorganic compound powder which can be generally added to an encapsulating resin can be used in the present invention as the first inorganic powder (d). It should be noted, however, that the first inorganic powder (d) should have an average particle diameter of 5 to 40 μm and should have a smooth outer surface substantially free from edges, ridges and projections.

Where the first inorganic powder (d) has an average particle diameter smaller than 5 μm, the flowability of the resin composition is significantly lowered. On the other hand, if the average particle diameter exceeds 40 μm, the flowability of the resin composition is rendered excessively high, leading to gate plugging of the molding die in the molding step of the resin composition.

The first inorganic powder (d) having a smooth surface substantially free from edges, ridges and projections includes, for example, a spherical powder obtained by fusing a surface of a pulverized inorganic compound powder; an inorganic compound powder having the cut edges decreased by controlling the pulverizing process; a powdery material prepared by growing on the surface of a pulverized inorganic compound particle a crystal of the same or different inorganic compound so as to smooth the outer surface of the particle; a powdery material having a smooth outer surface, which is prepared by treating the surface of a pulverized inorganic compound particle with a chemical substance to make the particle surface soluble; a powdery material prepared by baking a precursor of spherical inorganic compound particles, followed by pulverizing the baked material while controlling the pulverizing process such that edges or ridges are not formed in the pulverized particles; and a spherical inorganic compound particle prepared by bringing an evaporated raw material metal into contact with a reaction gas Such as oxygen or nitrogen gas, followed by cooling the system to form metal compound particles. It is also possible to use as the first inorganic powder (d) an inorganic compound powder having a smooth surface, which is obtained by baking a raw material compound together with a certain additive.

The inorganic compound providing the raw material of the first inorganic powder (d) includes, for example, fused silica, crystalline silica, alumina, magnesia, silicon nitride, aluminum nitride and boron nitride. These inorganic compounds can be used singly or in the form of a mixture of at least two of these compounds.

In the epoxy resin composition of the present invention, the second inorganic powder (e) is also used as an inorganic filler together with the first inorganic powder (d) described above. The second inorganic powder (e) should exhibit such a high heat conductivity as at least about 4.0 W/m·K at room temperature (25° C.) and should have an average particle diameter of 0.1 to 10 μm. In addition, the average particle diameter of the second inorganic powder (e) should be smaller than that of the first inorganic powder (d).

If the average particle diameter of the second inorganic powder (e) is smaller than 0.1 μm, the flowability of the resin composition is lowered. On the other hand, if the average particle diameter of the second inorganic powder (e) exceeds 10 μm, the abrasion of the molding die in the molding step is promoted. In addition, the mechanical strength of the cured resin composition is rendered insufficient. It should be noted that, even if the average particle diameter of the second inorganic powder (e) falls within a range of between 0.1 and 10 μm, it is possible for the average particle diameter of the second inorganic powder (e) to be larger than that of the first inorganic powder (d). In this case, it is impossible to obtain a sufficient mechanical strength of the resin composition.

The inorganic compound providing the raw material of the second inorganic powder (e) includes, for example, crystalline silica, alumina, magnesia, silicon nitride, aluminum nitride and boron nitride. Among these inorganic compounds, the nitride powder is preferred because the nitride powder serves to impart a high heat conductivity to the resin composition. These inorganic compounds can be used singly or in the form of a mixture of at least two of these compounds.

In order to enable the epoxy resin composition to exhibit improvements in flowability, heat dissipation, mechanical strength, etc. in a good balance, the mixing amount of the first inorganic powder (d) should be 10 to 50% by volume based on the sum of the first and second inorganic powders (d) and (e). If the mixing amount of the first inorganic powder (d) is smaller than 10% by volume, the flowability of the resin composition is lowered. If the mixing amount of the first inorganic powder (d) exceeds 50% by volume, however, the heat conductivity and the mechanical strength of the cured resin composition are impaired.

In the epoxy resin composition used in the present invention, the total amount of the first and second inorganic powders (d) and (e) should be about 40 to 90% by volume based on the entire amount of the resin composition. If the total amount of the inorganic powders is less than 40% by volume, it is difficult to obtain a sufficient heat conductivity of the cured resin composition. Also, the mechanical strength of the cured resin composition tends to be impaired. Further, the cured encapsulating resin layer exhibits a large thermal expansion coefficient, with the result that the resin encapsulated semiconductor device tends to be damaged when put under cooling-heating cycles. On the other hand, if the total amount of the inorganic powders exceeds 80% by volume, the flowability of the resin composition tends to be lowered.

In addition to the components described above, the epoxy resin composition used in the present invention may also contain additives, as desired, including, for example, a interface treating agent such as epoxy silane, a mold release agent such as wax, a flame retardant such as a phosphorus compound and a compound containing bromine or chlorine, and a low stress imparting agent such as a silicone compound or an organic rubber.

The epoxy resin composition used in the present invention can be prepared without difficulty by melt-kneading components (a) to (e) and other additives with heat rolls, a kneader, an extruder or the like. Alternatively, these components can be mixed by using a special mixer capable of finely pulverizing the components so as to obtain the desired resin composition. Further, the methods exemplified above can be employed in combination so as to obtain the desired epoxy resin composition.

The resin encapsulated semiconductor device of the present invention can be easily manufactured by encapsulating by the ordinary method a semiconductor element assembled on the lead frame with the epoxy resin composition described above. A low pressure transfer molding is most generally employed for forming the encapsulating resin layer 7 shown in FIG. 1. Alternatively, an injection molding, a compression molding, casting, etc. can also be employed for forming the encapsulating resin layer 7. Incidentally, the semiconductor element to be encapsulated and the specific type of the plastic package are not particularly restricted in the present invention.

As described above, the first and second inorganic powders (d) and (e) each having specified characteristics such as the shape, average particle diameter and heat conductivity are contained as inorganic fillers in the resin composition used in the present invention for encapsulating a semiconductor element. What should be noted is that the second inorganic powder (e), which has a high heat conductivity, serves to improve the heat dissipation through the encapsulating resin layer and to further improve the mechanical strength, elasticity, etc. of the encapsulating resin layer to desirable levels. Further, the second inorganic powder (e), which has a high hardness, has a small particle diameter, with the result that the abrasion of the molding die is suppressed in the molding step of the resin composition. On the other hand, the first inorganic powder (d) has a smooth surface substantially free from edges, ridges and projections. It follows that the flowability of the resin composition is improved without impairing the various characteristics of the resin composition by adding a smaller amount of the first inorganic powder (d). In addition, the abrasion of the mold is suppressed in the molding step of the resin composition so as to improve the workability.

Let us describe Examples of the present invention. Of course, the following Examples are intended to facilitate the understanding of the present invention and do not restrict the scope of the present invention.

EXAMPLES

Preparation of Epoxy Resin Compositions

Epoxy resin compositions shown in Table 1 were prepared as follows. The leftward arrow "←" in Table 1 denotes the same numeral as in the column on the left side.

In the first step, inorganic fillers were treated with a silane coupling agent within a Henschel mixer, followed by adding the other components and melt-kneading the resultant mixture with heat rolls set at 60° to 110° C. The kneaded mixture was cooled and, then, pulverized so as to obtain epoxy resin compositions E1 to E7, which are Examples of the present invention, and C1 to C6, which are Comparative Examples, shown in Table 1.

The specific components shown in Table 1 are as follows:

Epoxy Resin: ESCN-195X (trade name of ortho-cresol novolak type epoxy resin manufactured by Sumitomo Chemical Industries Inc., epoxy equivalent of 197);

Brominated Epoxy Resin: AER-755 (trade name of bisphenol A type brominated epoxy resin manufactured by Asahi Kasei K.K., epoxy equivalent of 460);

Curing Agent: BRG-557 (phenol novolak resin manufactured by Showa Kobunshi K.K., hydroxyl equivalent of 104);

Curing Promotor: PP-360 (trade name of triphenyl phosphine manufactured by KI Chemical Industries Inc.);

Mold Release Agent: Carnauba No. 1 (trade name of carnauba wax manufactured by Arakawa Rinsan K.K.);

Flame Retardant: Antimony trioxide manufactured by Mikuni Seiren K.K.;

Pigment: CB#30 (trade name of carbon black manufactured by Mitsubishi Petrochemical Co., Ltd.);

Silane Coupling Agent: A-187 (trade name of γ-glycidoxypropyl-trimethoxysilane manufactured by Nippon Unicar K.K.);

Inorganic Filler (f1): Alumina particles (no edges, average particle diameter of 20 μm, heat conductivity of 30 W/m·K, and specific gravity of 3.98);

Inorganic Filler (f2): Silicon nitride particles (pulverized, average particle diameter of 3 μm, heat conductivity of 20 W/m·K, and specific gravity of 3.17);

Inorganic Filler (f3): Boron nitride particles (hexagonal plate-like, average particle diameter of 0.8 μm, heat conductivity of 40 W/m·K, and specific gravity of 2.27);

Inorganic Filler (f4): Aluminum nitride particles (pulverized, water resistance treatment to the surface, average particle size of 1.4 μm, heat conductivity of 40 W/m·K, and specific gravity of 2.27);

Inorganic Filler (f5): Fused silica particles (spherical, average particle diameter of 20 μm. heat conductivity of 0.8 W/m·K, and specific gravity of 2.20);

Inorganic Filler (f6): Aluminum nitride particles (no edges, water resistance treatment to the surface, average particle size of 35 μm, heat conductivity of 40 W/m·K, and specific gravity of 2.27);

Inorganic Filler (f7): Alumina particles (pulverized, average particle size of 20 μm, heat conductivity of 30 W/m·K, and specific gravity of 3.98);

Inorganic fillers f1, f5 and f6 correspond to the first inorganic powder (d), with inorganic fillers f2, f3 and f4 corresponding to the second inorganic powder (e). On the other hand, inorganic filler f7 does not correspond to any of the first and second inorganic powders.

Inorganic filler f1 noted above denotes a spherical powder prepared by bringing a vaporized aluminum (raw material metal) into contact with oxygen, followed by cooling the resultant material. Inorganic filler f5 denotes a spherical powder prepared by forming a spherical precursor by synthesis, followed by baking and subsequently pulverizing the precursor. Further, inorganic filler f6 denotes an inorganic compound powder free from edges, which is prepared by baking a raw material together with a certain additive.

TABLE 1

| Components | Epoxy resin composition (Examples) | | | | | | | Epoxy resin composition (Comparative Examples) | | | | | |
| --- | --- | --- | --- | --- | --- | --- | --- | --- | --- | --- | --- | --- | --- |
| | E1 | E2 | E3 | E4 | E5 | E6 | E7 | C1 | C2 | C3 | C4 | C5 | C6 |
| Epoxy resin | 14.4 | ← | ← | ← | ← | ← | 13.7 | 14.4 | ← | ← | ← | ← | ← |
| Brominatal epoxy resin | 2.5 | ← | ← | ← | ← | ← | ← | 2.5 | ← | ← | ← | ← | ← |
| Phenol novolak resin | 8.2 | ← | ← | ← | ← | ← | 7.2 | 8.2 | ← | ← | ← | ← | ← |
| Triphenyl | 0.25 | ← | ← | ← | ← | ← | 0.21 | 0.25 | ← | ← | ← | ← | ← |

TABLE 1-continued

| Components | Epoxy resin composition (Examples) | | | | | | | Epoxy resin composition (Comparative Examples) | | | | | |
| --- | --- | --- | --- | --- | --- | --- | --- | --- | --- | --- | --- | --- | --- |
| | E1 | E2 | E3 | E4 | E5 | E6 | E7 | C1 | C2 | C3 | C4 | C5 | C6 |
| phosphine | | | | | | | | | | | | | |
| Carnauba wax | 0.4 | ← | ← | ← | ← | ← | ← | 0.4 | ← | ← | ← | ← | ← |
| Antimory trioxide | 2.0 | ← | ← | ← | ← | ← | ← | 2.0 | ← | ← | ← | ← | ← |
| Carbon black | 0.3 | ← | ← | ← | ← | ← | ← | 0.3 | ← | ← | ← | ← | ← |
| Silan coupling agent | 0.3 | ← | ← | ← | ← | ← | ← | 0.3 | ← | ← | ← | ← | ← |
| Inorganic Fillers | | | | | | | | | | | | | |
| (f1) | 26.1 | 65.1 | 26.1 | 26.1 | 13.1 | — | — | — | 130.0 | — | — | 104.2 | — |
| (f2) | 83.0 | 51.9 | 74.7 | — | 83.0 | 83.0 | 64.4 | — | — | 103.7 | 51.9 | 20.7 | 20.7 |
| (f3) | — | — | 5.9 | — | — | — | — | — | — | — | — | — | — |
| (f4) | — | — | — | 84.3 | — | — | — | — | — | — | — | — | — |
| (f5) | — | — | — | — | 7.2 | — | — | 72.0 | — | — | — | — | — |
| (f6) | — | — | — | — | — | 21.1 | 43.3 | — | — | — | — | — | 84.3 |
| (f7) | — | — | — | — | — | — | — | — | — | — | 65.1 | — | — |

(Parts by weight)

Evaluation of Characteristics of Epoxy Resin Composition

The flowability and the characteristics after being cured of the epoxy resin composition thus prepared were evaluated as follows:

(1) Evaluation of Flowability

The melt viscosity of each of the epoxy resin compositions at 175° C. was measured by using a down-flow type flow tester.

(2) Evaluation of Characteristics after being cured

Each of the epoxy resin compositions was molded by a low pressure transfer molding machine for 3 minutes at a molding temperature of 185° C., followed by applying an after-cure treatment at 200° C. for 8 hours so as to obtain a test piece. The thermal expansion coefficient, bending modulus (25° C.), bending strength (25° C.) and heat conductivity (25° C.) were measured for each of the test pieces.

Each of the epoxy resin compositions was also molded in a manner of a continuous shot by using a mold having an aluminum projection formed in the mold cavity. The abrasion of the mold cavity surface after the molding operation was visually evaluated.

Table 2 shows the results of these evaluations. As apparent from Table 2, epoxy resin compositions E1 to E5 are superior to compositions. C1 to C6 in the balance among the flowability in the molten stage and the characteristics after the curing stage such as the thermal expansion coefficient, heat conductivity and mechanical strength. In addition, the abrasion of the mold in the molding step is suppressed in compositions E1 to E5 of the present invention.

TABLE 2

| No. | Measured items | Epoxy resin composition (Examples) | | | | | | |
| --- | --- | --- | --- | --- | --- | --- | --- | --- |
| | | E1 | E2 | E3 | E4 | E5 | E6 | E7 |
| (1) | Melt viscosity (poise) | 300 | 200 | 370 | 300 | 250 | 300 | 370 |
| (2) | Thermal expansion coefficient ($10^{-5} \cdot deg^{-1}$) | 1.7 | 1.9 | 1.8 | 1.7 | 1.6 | 1.7 | 1.6 |
| | Bending modulus (kg · mm$^{-2}$) | 1850 | 1800 | 1800 | 1800 | 1750 | 1700 | 1850 |
| | Bending strength (kg · mm$^{-2}$) | 18.0 | 17.0 | 18.0 | 18.0 | 18.0 | 18.0 | 18.5 |
| | Heat conductivity (W · m$^{-1}$K$^{-1}$) | 3.4 | 2.7 | 3.8 | 3.4 | 3.0 | 3.8 | 4.0 |
| | Abrasion of mold (visual obseration) | small | small | small | small | small | small | small |

TABLE 2-continued

| No. | Measured items | Epoxy resin composition (Comparative Examples) | | | | | |
| --- | --- | --- | --- | --- | --- | --- | --- |
| | | C1 | C2 | C3 | C4 | C5 | C6 |
| (1) | Melt viscosity (poise) | 180 | 1000 | >2000 | 800 | 280 | 600 |
| (2) | Thermal expansion coefficient ($10^{-5} \cdot deg^{-1}$) | 1.9 | 2.2 | 1.6 | 1.9 | 2.1 | 1.9 |
| | Bending modulus (kg · mm$^{-2}$) | 1500 | 1700 | 1900 | 1850 | 2000 | 1900 |
| | Bending strength (kg · mm$^{-2}$) | 15.0 | 15.0 | 18.5 | 17.5 | 15.5 | 15.0 |
| | Heat conductivity (W · m$^{-1}$K$^{-1}$) | 0.6 | 2.5 | 3.5 | 2.7 | 2.7 | 3.5 |
| | Abrasion of mold (visual obseration) | very small | small | middle | large | small | small |

A resin encapsulation type semiconductor device was manufactured by using the epoxy resin composition thus prepared, followed by evaluating the heat dissipation, thermal shock resistance and humidity resistance reliability of the semiconductor device as follows:

(3) Evaluation of Heat Dissipation

A testing semiconductor element chip with heat generation of 1 W was encapsulated with each of the epoxy resin compositions so as to prepare a resin encapsulation type semiconductor device. The device thus prepared was operated, and the steady state temperature on the upper surface of the element was measured so as to determine the heat dissipation performance of the device.

(4) Evaluation of the Thermal Shock Resistance

A testing semiconductor element chip (6 mm × 6 mm) was encapsulated with each of the epoxy resin compositions so as to prepare a resin encapsulation type semiconductor device, followed by applying a cooling-heating cycle test (TCT) to the device so as to evaluate the operating characteristics of the device and, thus, to determine the number of defective devices. In each cycle of the TCT test, the resin encapsulation type semiconductor device was cooled at −65° C. for 30 minutes, followed by holding the device at room temperature for 5 minutes and subsequently heating the device at 150° C. for 30 minutes.

(5) Evaluation of the Humidity Resistance Reliability

A testing semiconductor element chip was encapsulated with each of the epoxy resin compositions so as to prepare a resin encapsulation type semiconductor device, followed by applying a pressure cooker test (PCT) to the device. Specifically, the resin encapsulation type semiconductor devices were left to stand under a steam-saturated atmosphere of 127° C. so as to determine the occurrence of defective devices including leakage defects and open defects.

Table 3 shows the results of these evaluations. As apparent from Table 3, the resin encapsulation type semiconductor devices prepared by using epoxy resin compositions E1 to E7 of the present invention are superior in heat dissipation performance to the devices prepared by using compositions for the Comparative Examples. In addition, the devices prepared by using compositions E1 to E7 were substantially free from defect occurrence in each of the TCT test and the PCT test, which indicates excellent-thermal shock resistance and humidity resistance reliability of the device. It is considered reasonable to understand that the excellent performance of the resin encapsulation type semiconductor device of the present invention is derived from the excellent characteristics shown in Table 2 of the encapsulating epoxy resin composition defined in the present invention.

ability in the molten state, capability of suppressing the abrasion of the molding die in the molding step, and an excellent heat conductivity and mechanical strength after the curing. It follows that the resin encapsulation type semiconductor device of the present invention fully meets the requirements for increases in the integration density and operation speed of the electronic equipment.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plastic package type semiconductor device having a semiconductor element encapsulated with an epoxy resin composition, said resin composition containing as indispensable components:
   (a) an epoxy resin;
   (b) a curing agent;
   (c) a curing promotor;
   (d) a first inorganic powder having an average diameter of 5 to 40 $\mu$m and a smooth outer surface substantially free from edges, ridges and projections; and
   (e) a second inorganic powder having an average diameter of 0.1 to 10 $\mu$m and a heat conductivity of at least 4.0 W/m·K with the restriction that the average diameter of the second inorganic powder is smaller than the average diameter of the first inorganic powder; and the mixing amount of the first inorganic powder (d) being 10 to 50% by volume based on the sum of the first inorganic powder (d) and the second inorganic powder (e).

2. The plastic package type semiconductor device according to claim 1, wherein the total amount of the

TABLE 3

| No. | Measure Items | Composition | Examples | | | | | | |
|---|---|---|---|---|---|---|---|---|---|
| | | | E1 | E2 | E3 | E4 | E5 | E6 | E7 |
| (3) | Steady temperature of upper surface (°C.) | | 52 | 58 | 50 | 52 | 58 | 50 | 49 |
| (4) | TCT Test (Defective samples/ Total samples) | 50 cycles | 0/20 | 0/20 | 0/20 | 0/20 | 0/20 | 0/20 | 0/20 |
| | | 100 cycles | 0/20 | 0/20 | 0/20 | 0/20 | 0/20 | 0/20 | 0/20 |
| | | 150 cycles | 0/20 | 0/20 | 0/20 | 0/20 | 0/20 | 0/20 | 0/20 |
| | | 300 cycles | 0/20 | 1/20 | 2/20 | 0/20 | 0/20 | 0/20 | 0/20 |
| | | 400 cycles | 0/20 | 5/20 | 4/20 | 0/20 | 0/20 | 0/20 | 0/20 |
| (5) | PCT Test (Defective samples/ Total samples) | 50 hours | 0/20 | 0/20 | 0/20 | 0/20 | 0/20 | 0/20 | 0/20 |
| | | 100 hours | 0/20 | 0/20 | 0/20 | 0/20 | 0/20 | 0/20 | 0/20 |
| | | 150 hours | 0/20 | 0/20 | 0/20 | 0/20 | 0/20 | 0/20 | 0/20 |
| | | 300 hours | 0/20 | 0/20 | 0/20 | 0/20 | 0/20 | 0/20 | 0/20 |
| | | 400 hours | 0/20 | 0/20 | 2/20 | 1/20 | 0/20 | 0/20 | 0/20 |

| No. | Measure Items | Composition | Comparative Examples | | | | | |
|---|---|---|---|---|---|---|---|---|
| | | | C1 | C2 | C3 | C4 | C5 | C6 |
| (3) | Steady temperature of upper surface (°C.) | | 70 | 56 | 52 | 58 | 58 | 52 |
| (4) | TCT Test (Defective samples/ Total samples) | 50 cycles | 0/20 | 0/20 | 0/20 | 0/20 | 0/20 | 0/20 |
| | | 100 cycles | 0/20 | 1/20 | 0/20 | 0/20 | 0/20 | 0/20 |
| | | 150 cycles | 0/20 | 15/20 | 0/20 | 0/20 | 5/20 | 10/20 |
| | | 300 cycles | 0/20 | 20/20 | 2/20 | 2/20 | 20/20 | 20/20 |
| | | 400 cycles | 0/20 | — | 5/20 | 5/20 | — | — |
| (5) | PCT Test (Defective samples/ Total samples) | 50 hours | 0/20 | 0/20 | 0/20 | 0/20 | 0/20 | 0/20 |
| | | 100 hours | 0/20 | 0/20 | 0/20 | 0/20 | 0/20 | 0/20 |
| | | 150 hours | 0/20 | 0/20 | 0/20 | 0/20 | 0/20 | 0/20 |
| | | 300 hours | 0/20 | 3/20 | 0/20 | 0/20 | 0/20 | 5/20 |
| | | 400 hours | 0/20 | 8/20 | 1/20 | 2/20 | 5/20 | 6/20 |

As described above in detail, the present invention provides a resin encapsulation type semiconductor device exhibiting excellent thermal shock resistance and humidity resistance reliability. In the semiconductor device of the present invention, a semiconductor element is encapsulated with an epoxy resin composition exhibiting in a good balance the characteristics required for the encapsulating resin such as a satisfactory flow-first and second inorganic powders (d) and (e) accounts for about 40 to 90% by volume of the entire resin composition.

3. The plastic package type semiconductor device according to claim 1, wherein said first inorganic powder (d) is an inorganic compound powder selected from the group consisting of powders of fused silica, crystalline silica, alumina, magnesia, silicon nitride, aluminum nitride and boron nitride.

4. The plastic package type semiconductor device according to claim 1, wherein said second inorganic powder (e) is an inorganic compound powder selected from the group consisting of powders of crystalline silica, alumina, magnesia, silicon nitride, aluminum nitride and boron nitride.

5. The plastic package type semiconductor device according to claim 1, wherein the mixing amounts of said epoxy resin (a) and the curing agent (b) which is a phenolic resin are determined such that the equivalent ratio of the phenolic hydroxyl groups to the epoxy groups, i.e., OH equivalent/epoxy equivalent, falls within a range of between about 0.5 and about 1.5.

6. The plastic package type semiconductor device according to claim 1, wherein the mixing amount of said curing promotor (c) is about 0.01 to 10% by weight based on the sum of the epoxy resin (a) and the curing agent (b).

7. The plastic package type semiconductor device according to claim 1, wherein said semiconductor device is of flat package type.

8. The plastic package type semiconductor device according to claim 1, wherein said first inorganic powder (d) is selected from the group consisting of a spherical powder obtained by fusing a surface of a pulverized inorganic compound powder; an inorganic compound powder having the cut edges decreased by controlling the pulverizing process; a powdery material prepared by growing on the surface of a pulverized inorganic compound particle a crystal of the same or different inorganic compound so as to smooth the outer surface of the particle; a powdery material having a smooth outer surface, which is prepared by treating the surface of a pulverized inorganic compound particle with a chemical substance to make the particle surface soluble; a powdery material prepared by baking a precursor of spherical inorganic compound particles, followed by pulverizing the baked material while controlling the pulverizing process such that edges or ridges are not formed in the pulverized particles; spherical inorganic compound particle prepared by bringing an evaporated raw material metal into contact with a reaction gas such as oxygen or nitrogen gas, followed by cooling the system to form metal compound particles; and an inorganic compound powder having a smooth surface, which is obtained by baking a raw material compound together with a certain additive.

* * * * *